(12) United States Patent
Morin (10) Patent No.: US 8,168,292 B2
(45) Date of Patent: *May 1, 2012

(54) COMPOSITE MATERIALS INCLUDING AMORPHOUS THERMOPLASTIC FIBERS

(75) Inventor: Brian G. Morin, Greenville, SC (US)

(73) Assignee: Innegra Technologies, LLC, Greenville, SC (US)

( * ) Notice: Subject to any disclaimer, the term of this patent is extended or adjusted under 35 U.S.C. 154(b) by 852 days.

This patent is subject to a terminal disclaimer.

(21) Appl. No.: 11/453,502

(22) Filed: Jun. 15, 2006

(65) Prior Publication Data

US 2007/0292674 A1   Dec. 20, 2007

(51) Int. Cl.
*B32B 27/04* (2006.01)

(52) U.S. Cl. ............... 428/300.4; 428/299.4; 428/299.7

(58) Field of Classification Search ............... 428/295.1, 428/297.4, 299.4, 299.7, 300.4
See application file for complete search history.

(56) References Cited

U.S. PATENT DOCUMENTS

| | | | |
|---|---|---|---|
| 3,620,903 A | 11/1971 | Bunting, Jr. et al. | |
| 3,859,158 A | 1/1975 | Park | |
| 3,996,404 A | 12/1976 | Matsumoto et al. | |
| 4,498,941 A | 2/1985 | Goldsworthy | |
| 4,668,545 A | 5/1987 | Lowe | |
| 4,683,165 A | 7/1987 | Lindemann et al. | |
| 4,882,223 A | 11/1989 | Aptel et al. | |
| 4,886,578 A | 12/1989 | Hendren et al. | |
| 4,985,293 A | 1/1991 | Keep | |
| 4,997,702 A | 3/1991 | Gazit et al. | |
| 5,093,435 A | 3/1992 | Harris et al. | |
| 5,190,997 A | 3/1993 | Lindemann et al. | |
| 5,356,691 A | 10/1994 | Yamamoto et al. | |
| 5,367,046 A | 11/1994 | Dorogy, Jr. et al. | |
| 5,496,613 A | 3/1996 | Middelman et al. | |
| 5,512,119 A * | 4/1996 | Takezawa et al. | 156/171 |
| 5,559,199 A * | 9/1996 | Abe et al. | 526/160 |
| 5,571,609 A | 11/1996 | St. Lawrence et al. | |
| 5,599,611 A | 2/1997 | Afzali-Ardakani et al. | |
| 5,667,743 A | 9/1997 | Tai et al. | |
| 5,858,887 A | 1/1999 | St. Lawrence et al. | |
| 5,869,412 A | 2/1999 | Yenni, Jr. et al. | |
| 5,972,811 A | 10/1999 | St. Lawrence et al. | |
| 6,071,836 A | 6/2000 | St. Lawrence et al. | |
| 6,337,379 B2 | 1/2002 | Matsukura et al. | |
| 6,440,558 B2 | 8/2002 | Klaus et al. | |
| 6,447,886 B1 | 9/2002 | Mohamed et al. | |
| 6,539,596 B1 | 4/2003 | Hwo et al. | |

(Continued)

OTHER PUBLICATIONS

Brian G. Morin, U.S. Appl. No. 11/671,698, filed Feb. 6, 2007, Low Dielectric Loss Composite Material.

(Continued)

*Primary Examiner* — Lynda Salvatore
(74) *Attorney, Agent, or Firm* — Douglas W. Kim; McNair Law Firm, P.A.

(57) ABSTRACT

Disclosed are composites that can exhibit low transmission energy loss and can also be temperature resistant. The composites include reinforcement fibers held in a polymeric matrix. The reinforcement fibers can include an amorphous polymer component. The fibers can be woven or knit to form a fabric or can be included in a nonwoven fabric. The composites can include other fibers as well, such as fiberglass. The composites can be multi-layer structures and can include layers of other materials, for instance layers formed of polyaramids, fiberglass, or carbon fiber wovens or nonwovens. The composites can advantageously be utilized in low loss dielectric applications, such as in forming circuit board substrates.

9 Claims, 2 Drawing Sheets

U.S. PATENT DOCUMENTS

| | | | |
|---|---|---|---|
| 6,657,005 | B1 | 12/2003 | Nishihata et al. |
| 6,701,703 | B2 | 3/2004 | Patrick |
| 6,866,912 | B2 | 3/2005 | Higgins et al. |
| 6,887,943 | B2 | 5/2005 | Onoe et al. |
| 6,890,965 | B1 | 5/2005 | Johnson et al. |
| 6,929,848 | B2 | 8/2005 | Samuels et al. |
| 6,980,076 | B1 | 12/2005 | Rolling et al. |
| 7,074,483 | B2 | 7/2006 | Morin |
| 7,648,758 | B2 * | 1/2010 | Morin ................. 428/292.1 |
| 2002/0159943 | A1 | 10/2002 | Smalley et al. |
| 2002/0172816 | A1 | 11/2002 | Perez et al. |
| 2004/0092183 | A1 | 5/2004 | Geva et al. |
| 2004/0227687 | A1 | 11/2004 | Delgado et al. |
| 2005/0201715 | A1 | 9/2005 | Ellwood, Jr. |
| 2005/0260911 | A1 | 11/2005 | Ochi et al. |
| 2005/0287239 | A1 | 12/2005 | Joo et al. |
| 2006/0246284 | A1 | 11/2006 | Oh et al. |

OTHER PUBLICATIONS

Brian G. Morin, U.S. Appl. No. 11/671,722, filed Feb. 6, 2007, Method of Forming Low Dielectric Loss Composite Material.

Executive Summary—*International Technology Roadmap for Semiconductors*, 2003 Edition, 73 pages, public.itrs.net.

Overview of EIA Annual Energy Outlook 2004 with Projections to 2025, 2004, 8 pages, www.eia.doe.gov.

Presentation entitled *No Exponential is Forever . . . but We Can Delay Forever* by Gordon E. Moore at the International Solid State Circuits Conference, 2003, 29 pages, www.intel.com.

Presentation entitled *Signal Integrity Characterization of Printed Circuit Board Parameters* by Patel et al. at DesignCon 1999, 2002, 8 pages, www.teradyne.com.

Press Release from BP Global entitled *BP to Launch Next Generation Self-Reinforced Composites*, Mar. 16, 2001, 2 pages, www.bp.com Product Data on Cyclic Olefin Copolymer (COC) from Topas®, Mar. 2006, 20 pages.

Product Data on Noryl® EN265 from GE Plastics, Oct. 2001, 3 pages.

Product Data on Ultem® 1000 from GE Plastics, Apr. 2003, 4 pages.

Brian G. Morin, U.S. Appl. No. 11/205,575, filed Aug. 17, 2005, Composite Materials Including High Modulus Polyolefin Fibers.

Brian G. Morin, U.S. Appl. No. 11/205,662, filed Aug. 17, 2005, Low Dielectric Composite Materials Including High Modulus Polyolefin Fibers.

Brian G. Morin, U.S. Appl. No. 11/205,661, filed Aug. 17, 2005, Methods of Forming Composite Materials Including High Modulus Polyolefin Fibers.

Final Office Action in co-pending U.S. Appl. No. 11/671,722, dated Oct. 7, 2009.

Notice of Allowance and Fees Due in co-pending U.S. Appl. No. 11/671,698 dated Oct. 19, 2009.

* cited by examiner

COMPOSITE MATERIALS INCLUDING AMORPHOUS THERMOPLASTIC FIBERS

BACKGROUND OF THE INVENTION

Formable composites are known for use in electrical applications. These composites are generally utilized as supporting substrates, insulating layers, and/or casements for electrical devices. Ideally, the composite materials provide excellent electrical and mechanical properties, e.g., high circuit density, low transmission energy loss, high strength, low weight, etc., and provide all desired characteristics at low cost. Problems still exist with attaining this ideal, however.

Formable composite materials generally include reinforcement fibers held in a polymer matrix, often with additional components as well to improve characteristics such as thermal conductivity, adhesion, color, etc. Unfortunately, the components that make up the composite, while supporting one or more desired properties, often detract from others. For instance, glass fibers can offer excellent tensile strength characteristics, but have a dielectric constant of about 6, and thus are often unsuitable for low transmission energy loss applications, particularly if used in abundance. Accordingly, glass fibers have been combined with resins that exhibit desirable electrical characteristics to form composites having acceptable electrical as well as physical properties, though at the cost of compromising somewhat on overall performance.

Polymeric materials have been utilized to provide fibrous reinforcement in composites. For instance, fibers formed of engineering polymers such as ultra-high molecular weight polyethylene (UHMWPE) have been examined as have a variety of polyaramid fibers. Problems still exist with these materials as well. For instance, UHMWPE fibers can have good electrical characteristics, but have a low temperature resistance, with a melt temperature around 135° C., and thus cannot be used in high temperature applications. Polyaramid fibers, while they can be quite strong, also have limited temperature resistance and often exhibit unacceptably high loss. In addition, these highly engineered polymers are often quite expensive to formulate and process.

While there have been improvements in materials and methods for forming composites for use in electrical applications, there remains room for further improvement and variation within the art.

SUMMARY OF THE INVENTION

In one embodiment, the invention is directed to a composite for use in electrical applications. The composite can include a polymeric resin matrix and reinforcement fibers. The fibers can include one or more amorphous polymers. In one embodiment the polymeric component of the fibers can be exclusively amorphous and the fibers can exhibit only amorphous halo type scattering when observed under wide angle x-ray scattering. The fibers can also have a low dielectric constant, for instance, less than about 3.5. The fibers can also be quite stiff, and can have a modulus greater than about 70 grams per denier. In one particular embodiment, the amorphous polymer fiber can include a cyclic olefin copolymer.

The fibers can be a component of a fabric that can be held in a resin matrix. In some embodiments, a fabric can include these first fibers in addition to a second fiber type. For example, the fibers including an amorphous polymer component can be combined with a second fiber type in a composite fiber, or the second fiber type can be interwoven with the amorphous polymer fibers in a woven fabric. The second fibers can exhibit desired physical characteristics, for instance, the second fibers can have a high modulus, for example greater than about 150 grams/denier. In one particular embodiment, a fabric can include the fibers including an amorphous polymer component in combination with glass fibers.

Polymeric resins for use in the composites can be thermoset resins, thermoplastic resins, or a combination thereof. For instance, the composites can be multi-layer composites utilizing the same or different resins within and/or between layers. In a multi-layer embodiment, the composites can include one or more fabric layers including the fabrics and/or fibers described above as well as layers of other materials. For example, a multi-layer composite can include external layers including fiber glass reinforcement and inner layers including the low dielectric constant fibers described herein.

The composites can be well-suited for many electrical applications. For example, the composites can describe a low dielectric constant, for instance less than about 4.0, and can be light weight, with a density of less than about 2.0 g/cm$^3$. Exemplary applications of the disclosed composites can include circuit board substrates, radomes, and so forth.

BRIEF DESCRIPTION OF THE FIGURES

A full and enabling disclosure of the present invention, including the best mode thereof, to one of ordinary skill in the art, is set forth more particularly in the remainder of the specification, including reference to the accompanying Figures in which.

Repeat use of reference characters in the present specification and drawings is intended to represent the same or analogous features or elements of the present invention.

DETAILED DESCRIPTION OF THE INVENTION

Reference will now be made in detail to various embodiments of the invention, one or more examples of which are set forth below. Each embodiment is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used in another embodiment to yield a still further embodiment. Thus, it is intended that the present invention cover such modifications and variations as come within the scope of the appended claims and their equivalents.

DEFINITIONS

The term 'amorphous polymer' is herein defined to refer to polymers that do not exhibit any degree of crystallinity. In particular, amorphous polymers exhibit no temperature of crystallization and no melting temperature.

The term 'semi-crystalline polymer' is herein defined to refer to polymers that can exhibit a crystalline structure. In particular, it should be understood that though semi-crystalline polymers can be found in an amorphous state, they are not amorphous polymers. Hence, the amorphous state and amorphous portions of a semi-crystalline polymer should not be confused with an amorphous polymer.

A semi-crystalline polymer can exhibit crystalline structure, while an amorphous polymer cannot. In particular, a semi-crystalline polymer can be made to exhibit a crystalline reflection pattern when observed under wide angle x-ray scattering, characterized by a pattern of x-ray scattering spots or rings, from which symmetry or other characteristics of the crystalline phase of the material can be determined. An amorphous polymer will only exhibit much broader amorphous halos, though some broad ring structure may be present. These patterns are well known to those skilled in the art of polymer morphology.

The term 'fiber' is herein defined to encompass a structure that exhibits a length that exceeds the largest cross-sectional dimension (such as, for example, the diameter for round fibers). Thus, the term fiber as utilized herein differs from other structures such as plaques, containers, sheets, films and the like. The term does encompass, however, structures including monofilament fibers, multi-filament fibers, yarns, tape fibers, and the like.

The term 'multi-filament yarn' is herein defined to encompass a structure that includes at least three filaments that have been individually formed such as via extrusion through a spinneret prior to being brought in proximity to one another to form a single yarn structure.

The term 'composite yarn' is herein defined to refer to a yarn formed from the combination of two different fiber types.

The term 'fabric' is herein defined to encompass any planar textile structure produced by the interlacing or other combination of yarns, multi-filament fibers, monofilament fibers, or some combination thereof.

DETAILED DESCRIPTION

In general, the present invention is directed to low transmission energy loss composite materials for use in electrical applications as circuit boards, insulators, electronic packages, antennas, wireless devices or housings, radomes, and the like. The composites include reinforcement fibers held in a polymeric matrix. More specifically, the reinforcement fibers include polymeric fibers formed of one or more amorphous thermoplastic polymers. The composites of the invention can exhibit improved characteristics as compared to previously known composite materials. For instance, the disclosed composites can exhibit very low transmission energy loss and high thermal resistivity while being economical to produce.

Amorphous thermoplastic polymers encompassed by the present invention can include any thermoplastic polymer that exhibits no crystallization temperature. For example, amorphous thermoplastic polymers encompassed herein can exhibit only amorphous halo type scattering when observed under wide angle x-ray scattering and a distinct absence of crystalline rings or spots. In one embodiment, amorphous thermoplastic polymers of the invention exhibit a glass transition temperature greater than about 140° C. Amorphous thermoplastic polymers encompassed by the invention include, without limitation, polymethyl methacrylate (PMMA), atactic polystyrene, cyclic olefin copolymers, polycarbonate, polyetherimides, polyisoprene, polybutadiene, and the like. One exemplary cyclic olefin copolymer suitable for the present invention is Topas® resin, available from Ticona Engineering Polymers.

The amorphous polymers used to form the reinforcement fibers can be of any standard melt flow. For example, in one embodiment, standard extrusion grade cyclic olefin copolymer (COC) resin possessing ranges of melt volume flow rate (MVR) between about 1 and about 30 can be utilized. In one embodiment, COC possessing an MVR between about 2 and about 10 can be utilized. In one embodiment, the COC utilized in forming the fibers can have an MVR between about 3 and about 7.

The reinforcement fibers of the composite materials can be formed of one or more amorphous polymers in any combination or configuration. For instance, the amorphous polymers can be either homopolymers or copolymers, as desired. Moreover, copolymers can include random, block, or graft copolymers, as desired. For instance, a cyclic olefin copolymer can be utilized to form the fibers. In another embodiment, a blend of polymers can be utilized, as is generally known in the art.

When considering copolymers and blends of polymers, the fibers can, in certain embodiments, include a semi-crystalline polymer component. For instance, the fibers can be formed of a copolymer including an amorphous component and a semi-crystalline component. Similarly, the fibers can be formed from a polymer blend including an amorphous polymer, e.g., atactic polystyrene, blended with a semi-crystalline polymer, e.g., polypropylene. In such embodiments, however, the semi-crystalline component will be present in amounts such that the formed fibers exhibit the desired electrical and thermal characteristics, discussed in more detail below, that can be obtained due to the presence of the amorphous polymers. This blend or copolymer with a semi-crystalline polymer may exhibit crystalline scattering under wide angle x-ray scattering. One such blend, by way of example only, would be a cyclic olefin copolymer blended with polypropylene. This blend may exhibit superior processing, fiber formation, and fiber tensile properties while retaining significant thermal stability and low dielectric constant and loss.

Figure 1:
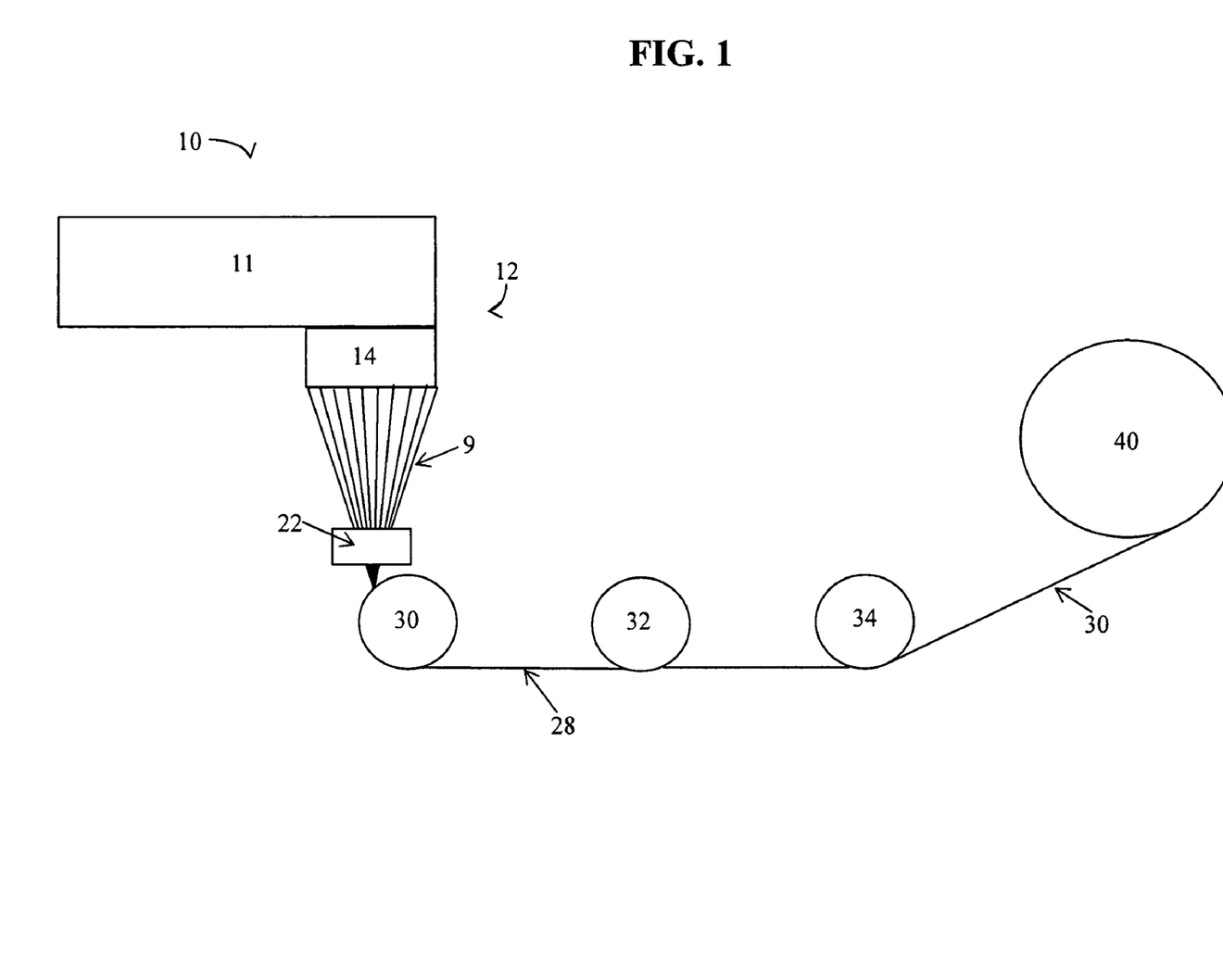
FIG. 1 is a schematic representation of one method of forming amorphous thermoplastic fibers for use in the disclosed composites.

The fibers of the disclosed composites can be monofilament or multifilament fibers, and can be formed according to any suitable process. One embodiment of a process 10 for forming amorphous polymer multifilament fibers suitable for use in the present invention is schematically illustrated in FIG. 1.

According to this embodiment, a polymeric composition can be provided to the extruder apparatus 12. The polymeric composition can include one or more amorphous polymers as well as any desired additives as are generally known in the art. For example, the mixture can include suitable coloring agents, such as dyes or other pigments. Other additives that can be combined with the mixture can include, for example, one or more of anti-static agents, antioxidant agents, antimicrobial agents, adhesion agents, stabilizers, plasticizers, brightening compounds, clarifying agents, ultraviolet light stabilizing agents, nucleating agents, surface active agents, odor enhancing or preventative agents, light scattering agents, halogen scavengers, and the like. In addition, additives can be included in the extrusion mixture or can be applied as a surface treatment to either the undrawn formation or optionally to the drawn material.

In one embodiment, an additive can be included that can leave reactive groups on the surface of the extrusion product. Reactive groups can be added to improve the adhesion of the fiber to other materials utilized in forming the composite structures. For example, maleic anhydride can be included in the mixture, leaving functional groups on the surface of the fibers capable of reacting with unsaturated polyester resins. Surface functionality can improve bonding of the fiber with secondary materials, such as the polymeric resin for instance, and improve adhesion between the different materials forming the composites.

The extruder apparatus 12 can be any spinneret apparatus as is generally known in the art. For example, the extruder apparatus 12 can include a mixing manifold 11 in which a polymeric composition can be combined, mixed and heated to form an extrudable composition. The mixture can then be conveyed under pressure to the spinneret 14 where it can be extruded at a high temperature through multiple spinneret orifices to form multiple filaments 9.

Following extrusion of the polymer, a lubricant can be applied to the fibers. For example, a spin finish can be applied at a spin finish applicator chest 22, as is generally known in the art. Any suitable lubricant can be applied to the filaments 9. For example, a suitable oil-based finish such as Lurol PP-912, available from Ghoulston Technologies, Inc. can be applied to the filaments 9. Addition of a finishing or lubricant coat can improve handling of the fiber bundle during subsequent processing and can also reduce friction and static electricity build-up on the finished yarn. In addition, a finish coat on the yarn can improve slip between individual filaments of the yarn during the drawing process and can increase the attainable draw ratio, and thus increase the modulus and tenacity of the drawn multi-filament yarn.

The filaments 9 can be gathered to form a fiber bundle 28 that can then be drawn. For instance, the fiber bundle 28 can be drawn utilizing a series of heated godet rolls 30, 32, 34. It should be understood that any suitable process that can place a force on the yarn so as to elongate the yarn following the quenching step can optionally be utilized. For example, any mechanical apparatus including nip rolls, godet rolls, steam cans, air, steam, or other gaseous jets can optionally be utilized to draw the yarn. As is known in the art, applying heat during the drawing step can facilitate a uniformly drawn yarn. Following the yarn drawing step, the drawn multi-filament yarn 30 can be wound on a take-up roll 40.

In one embodiment, the finished multi-filament yarn 30 can be wound on a spool or take-up reel 40, as shown, and transported to a second location for formation of the composite materials of the present invention. In an alternative embodiment, the multi-filament yarn can be fed directly to a second processing line, where the yarn can be further processed.

The invention is not limited to homogeneous fibers formed according to the above-described process. For instance, the amorphous polymer fibers can be extruded to include discrete sections formed of different compositions that can differ as to polymer, additives, or a combination thereof. For example, two or more compositions can be extruded to form fibers having a core/shell arrangement. In another embodiment, the fibers can vary in composition along the length of the fiber, with adjacent lengths of the fibers being formed of different compositions.

Moreover, fibers of the disclosed composites are not limited to extruded fibers. In one embodiment, the fibers may be cast from a solvent in a wet spinning, or dry spinning process, and then oriented through drawing as described above.

The disclosed composite structures can incorporate amorphous polymer fibers formed from a film. According to this embodiment, a film can be formed according to any known film-formation process, and following formation the film can be further processed to form the amorphous polymer fibers.

Figure 2:
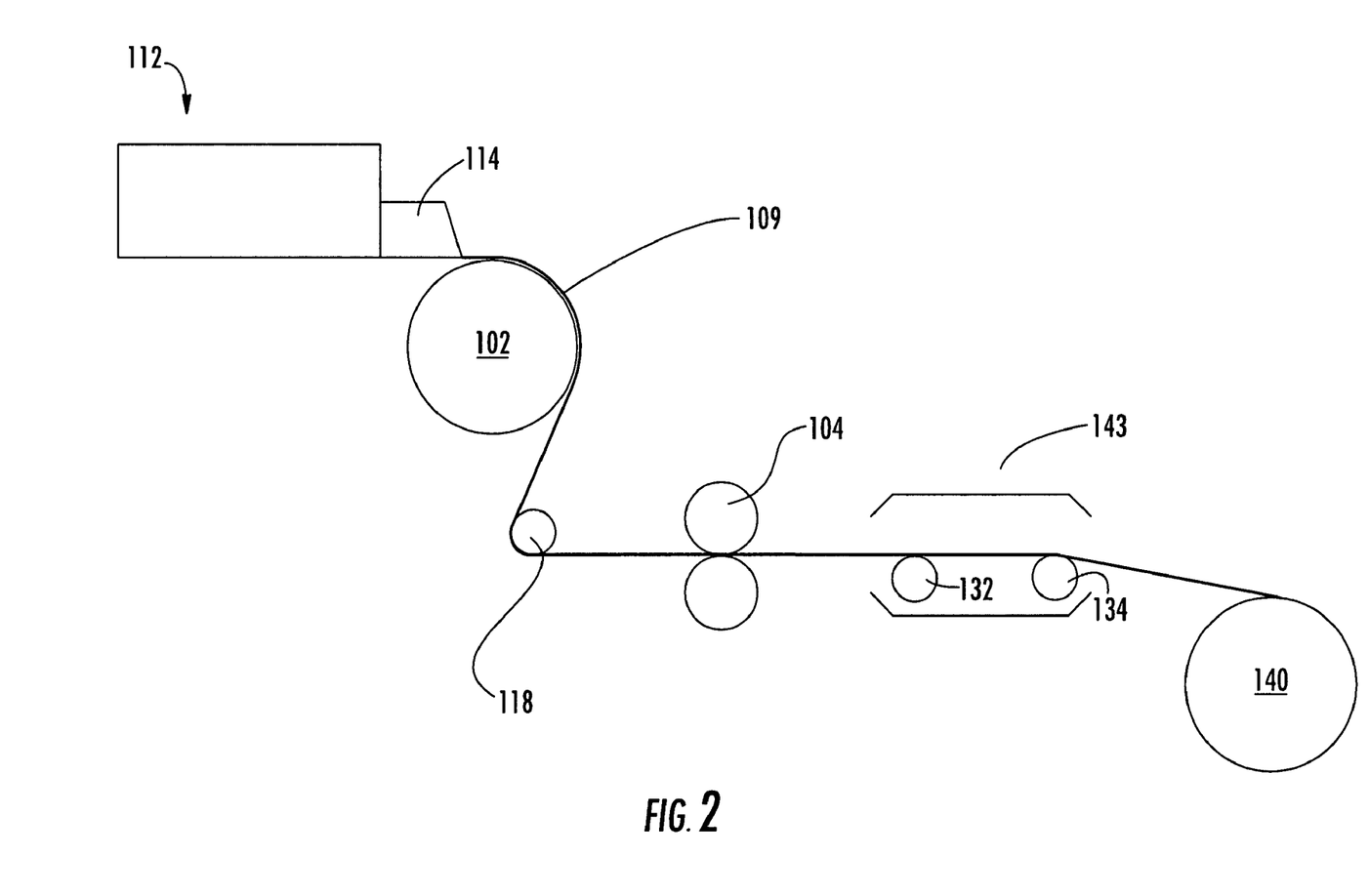
FIG. 2 is a schematic representation of one method of forming an extruded film that can be utilized in forming amorphous thermoplastic fibers for use in the disclosed composites.

One embodiment for forming an extruded film is schematically illustrated in FIG. 2. As can be seen, according to this embodiment, a polymeric composition can be provided to the extruder apparatus 112, and can be extruded through a die 114 in the form of a film or sheet 109. The thickness of the film 109 can generally be chosen according to the desired end use and can be achieved by control of the process conditions. For example, the film 109 can have a thickness in one embodiment of less than 100 mils (2.5 mm). In one embodiment, the film 109 can have a thickness between 2 and 20 mils (0.05 to 0.5 mm). However, depending on the characteristics desired for the fibers that will be formed from the film, the film 109 can optionally be cast at thicknesses outside of this range.

Following extrusion, the film 109 can be quenched on a heated casting drum 102. Quenching on a heated casting drum is not a requirement, however, and in other embodiments, the film may be quenched in air or in a fluid such as water, which may be heated.

After casting (and drawing, if any), the film 109 can be calendered, as at 104. After calendering, the film 109 can be drawn under conditions that are below those at which catastrophic failure of the film could take place. In one embodiment, when considering both the calendering and drawing steps, the combined draw ratio can be at least 10:1. In one embodiment, the combined draw ratio for an amorphous polymer film can be between about 10:1 and about 40:1.

As with the multi-filament fiber forming process discussed above, a draw can be performed cold and/or at an elevated temperature, for instance in heated bath, using heated draw rolls, or the like. In addition, the draw step can utilize two draw rolls, 132, 134, as illustrated, or optionally multiple draw rolls as well as any other suitable drawing method.

Following the draw step, the film 109 can be collected on a roll 140 for additional processing or optionally immediately sent to a second line for additional processing. The final thickness of the film can generally be determined by combination of the casting thickness, the calendering thickness and the draw ratio. In one embodiment, the final thickness of the film can be between about 1 and about 20 mils (about 0.025 to about 0.5 mm). In another embodiment, the film thickness can be between about 3 and about 10 mils (about 0.075 to about 0.25 mm).

The above process is an exemplary process only, and films of the amorphous polymers can be formed according to any film forming process as is generally known in the art including, without limitation, other extrusion methods or casting methods including solution casting methods such as spin casting.

Following formation of the film, the film can be further processed to form the fibers. For example, the film can be sliced or cut according to methods as are generally known in the art so as to form a plurality of fibers.

Following formation, the amorphous polymer fibers can have a low dielectric constant as well as a low dielectric loss. For example, the dielectric constant of the fibers can be below about 3.5, or below about 2.5, or even below about 2.2 in some embodiments.

In addition, the fibers can be thermally resistant. For instance, the fibers can have a glass transition temperature greater than about 140° C. In a preferred embodiment, the fibers can have a glass transition temperature greater than about 160° C.

In some embodiments, the fibers can have a modulus as measured according to ASTM D2256-02, which is incorporated herein by reference, greater than about 50 grams/denier. In one embodiment, the fibers can have a modulus greater than about 70 grams/denier. In addition, the fibers can have a tenacity greater than about 2.0 grams/denier as measured according to ASTM D2256-02. In one embodiment, the fibers can have a tenacity greater than about 2.5 grams/denier.

The amorphous polymer fibers can serve as reinforcement material in a fiber/resin composite. In one particular embodiment, the fibers can be a component of a fabric that can be held in a resin matrix. For instance, the amorphous polymer fibers can be included in a fabric formed according to a predetermined, organized, and interlaced pattern, herein referred to as a weave fabric (i.e., a fabric formed according to a weaving and/or knitting process). Alternatively, the fibers can be included in a fabric formed according to a random pattern (a nonwoven fabric) or the fibers can be included in a unidirectional prepreg fabric, in which multiple unidirectional fibers are aligned and held in the polymeric matrix.

A weave fabric can be formed according to any textile formation process and utilizing any weaving and/or knitting textile formation systems and devices as are generally known in the art suitable for use with the amorphous polymer fibers. For example, the fibers can be in the form of a relatively small yarn, about 40 denier, and the yarn can be incorporated in a weave structure of up to 100 picks per inch in either or both directions. When considering larger yarns, for example up to about 10,000 denier or even higher, the fibers can be formed into a fabric structure with only about 10 or even fewer picks per inch. In this way, composites of varying thicknesses and physical properties can be prepared. In addition, any weave pattern which allows the strength of the yarn to be transferred into the resin component is acceptable. For example, weave patterns such as twill and satin that are well known in the art can be utilized alone or in combination in the disclosed structures.

A nonwoven fabric incorporating the amorphous polymer fibers can be formed according to any suitable formation process as is generally known in the art. For example, a plurality of amorphous polymer fibers as herein described can be randomly laid on a traveling formation fabric. The fibers can optionally be bound to one another utilizing an adhesive, applied heat, applied pressure, or some combination thereof. Suitable adhesives are generally known in the art and can be applied during the fiber formation process or during the web-formation process, as desired.

In one embodiment, a fabric for inclusion in the disclosed composites can be formed entirely of the amorphous polymer fibers. For instance, both the pick and warp yarns of a weave fabric can be exclusively amorphous polymer yarns. The amorphous polymer yarns need not, however, be identical. For instance, the yarns can differ as to polymer make-up, additives, etc.

In another embodiment, a fabric can include other materials, in addition to the amorphous polymer fibers. For instance, amorphous polymer fibers can be combined with other fibrous materials to form a composite yarn. For example, a monofilament or multifilament amorphous polymer fiber can be combined with a fiber of a different material such as, but not limited to, glass fibers, carbon fibers, or fibers formed of other polymers such as ultra high molecular weight polyethylene (UHMWPE), fluororcarbon-based fibers such as polytetrafluoroethylene (PTFE), or polyaramids such as poly-paraphenylene terephthalamide (e.g., Kevlar®) to form a composite yarn.

Composite fibers can be formed according to any suitable composite fiber-forming process. For example, two or more fibers can be combined via twisting, false twist texturing, air texturing, or any other yarn texturing or combining process. In one embodiment, a composite yarn can be formed including an inner fiber formed of a first material and an outer wrapping comprising a different material. For instance, a composite fiber can include a high-strength inner fiber, such as a polyaramid fiber and an outer wrapping fiber of the low dielectric constant, high temperature resistant amorphous polymer fibers as herein described. One exemplary method for forming such composite yarns has been described in U.S. Pat. No. 6,701,703 to Patrick, which is incorporated herein by reference.

In another embodiment, a composite yarn can be formed according to an air-jet combinatorial method, such as that described in U.S. Pat. No. 6,440,558 to Klaus, et al., which is also incorporated herein by reference. These are merely exemplary methods, however, and multiple such suitable combinatorial processes are well known to one of ordinary skill in the art, and thus are not described at length herein.

In one composite yarn embodiment, the composite yarn can include amorphous polymer fibers combined with a semi-crystalline polymer fiber according to any suitable combination method. For example, a composite yarn can be utilized including an amorphous polymer fiber combined with a semi-crystalline fiber describing a fairly low melt temperature such as a polyethylene fiber having a melt temperature of about 135° C. Following formation, a fabric including the composite yarn can be subjected to heat and/or pressure sufficient to melt the semi-crystalline constituent. The semi-crystalline constituent can thus serve to bind and/or reinforce the fabric, or can form the polymeric matrix of the composite material. Multiple polymeric compositions are well known to those of ordinary skill in the art that have an appropriately low melting temperature for such an embodiment and are capable of being formed as fibers, and thus need not be described in detail herein.

In another embodiment, a fabric can be formed from a mixture of fiber or yarn types. For example, a fabric can be formed including amorphous polymer fibers in combination with glass fibers, carbon fibers, aramid fibers, composite fibers, or any other fiber type. The size, total number, direction, and location of the secondary fibers in the fabric can improve or define characteristics of the fabric. For example, the flexural and/or tensile strength characteristics of the fabric can be controlled through addition of secondary fibers at predetermined locations in the pick and/or warp of the fabric.

Prior to combining the amorphous polymer fibers with a resin matrix, the individual fibers or a fabric formed therefrom can be pre-treated, for instance to improve wettability or adhesion. For example, a fiber can be fibrillated, subjected to plasma or corona treatments, or treated with a surface sizing, all of which are generally known in the art, to improve or enhance the physical characteristics of the fiber or the fabric formed therefrom. In one embodiment, the fibers or fabric can be treated to increase the surface area of the material, for instance via a fibrillation process, so as to improve adhesion between the fibrous reinforcement and the resin matrix. For example, fibers, films, or fabrics can be fibrillated or microfibrillated to improve adhesion.

In one embodiment, materials forming the composites can be surface functionalized, for instance to promote formation of a strong bond between materials during the composite formation process. Functionalization may be obtained according to any suitable method. For example, a fiber sizing can be coated onto the individual fibers prior to forming a fabric or optionally onto the fabric itself. A suitable sizing can include any sizing that is capable of bonding to the fiber surface while leaving reactive groups for bonding to a matrix resin or for bonding directly to another layer of the composite.

In one particular embodiment, organic materials to be included in the composite structure can be oxidized, so as to promote better bonding between materials. For example, amorphous polymer fibers can be oxidized either before or after a fabric forming process according to any suitable oxidation method including, but not limited to, corona discharge, chemical oxidation, flame treatment, oxygen plasma treatment, or UV radiation. In one particular example, atmospheric pressure plasma such as that created with an Enercon Plasma3 unit using an 80% helium and 20% oxygen atmosphere at a moderate power level can be formed and a fabric or fiber can be treated with the plasma so as to create reactive groups that can improve wetting and binding of the fibers to thermoset resins such as epoxy or unsaturated polyester resin systems.

The fibrous reinforcement materials and the resin of the composites can be combined according to any of a variety of suitable processes. For purposes of the present disclosure composite formation processes have been broadly classified as either compression molding formation processes or thermoset resin molding processes. Optionally, a combination of both types of processes can be utilized to combine the materials. For example, a resin can first be combined with fibrous reinforcement materials via a compression molding process, and following this initial process the intermediate thus formed can be combined with additional layers via a thermoset resin molding process to produce a multi-layered composite structure.

In one embodiment, a compression molding process can be utilized in which the fibrous reinforcement materials, e.g., a fabric, can be compression molded with a low melt thermoplastic resin system. For example, a layer of a thermoplastic film can be located adjacent a fabric including the amorphous polymer fibers. Upon addition of heat and pressure during a compression molding process, the thermoplastic film can at least partially melt and bind the amorphous polymer fibers of the fabric.

Possible thermoplastic resins and films for use as a resin system can include, for example, low melt polyethylenes, low melt polypropylene copolymers, or low melt fluoropolymers, as are generally known in the art.

Thermoset resin systems can also be utilized in the disclosed composites. As is generally known in the art, a thermoset matrix resin can be applied to a formed fabric or optionally to the fibers forming the fabric, the composite structure can be shaped, generally in a mold, and the thermoset resin can be cured, optionally curing while the structure is held under pressure.

Any standard thermoset matrix resin can be utilized in conjunction with the amorphous polymer fibers. Exemplary thermoset resins suitable for use in forming the composites of the present invention can include, without limitation, phenolic polymers, melamine polymers, epoxies, silicones, unsaturated polyesters, polyurethanes, polyamides, polybutadienes, polyether block amides, polyetherimides, polyimides, polyureas, vinyl esters, fluoropolymers, cyanate esters, polyisoprenes, diene block copolymers, polyethylene terephthalate (PET), and the like. In one preferred embodiment, thermoset resins can be chosen based upon specific physical or electrical characteristics of the material. For instance, a low loss thermoset resin such as low loss epoxy or cyanate ester resins.

In some embodiments, the composites can be multi-layered structures, including a plurality of fibrous layers that can be secured to one another via compression molding, thermoset molding, or a combination thereof, using one or more desired resin system(s). Adjacent layers can be the same or different from one another. For example, two or more adjacent and essentially identical fabrics comprising amorphous polymer fibers can be secured to one another with a thermoplastic resin system utilizing a suitable compression molding process.

Similarly, when considering a thermoset resin system, the thermoset resin can be applied to a multi-layered structure according to any suitable process. For instance, after the individual layers have been brought into proximity and shaped in a mold, a liquid thermoset resin can be injected into the mold and cured.

Combinations of systems can also be utilized. For example, one or more layers can be compression molded to form an intermediate laminate, and multiple intermediate materials can then be combined with a thermoset resin system.

In addition to the one or more layers incorporating amorphous polymer fibers, the composites of the disclosed invention can include fabrics or layers of other materials. A non-limiting list of materials that can be included can include, without limitation, fiberglass woven and nonwoven fabrics; carbon fiber wovens and nonwovens; polymeric woven, nonwovens, films, sheets, and the like that can include any of a variety of polymeric fibers, polymeric matrices, or some combination thereof, including, for instance, fiber-reinforced thermoset matrices formed with halogenated polymers (e.g., PTFE, PVC, PVA, etc.), polyaramids (e.g., Kevlar®)), UHMWPE, and the like; metal films and foils; and/or liquid crystal materials.

These additional layers can add desirable physical characteristics to the composite structure such as tensile strength, flexural strength, or cross-direction permeation strength. For instance the, composite structure can include one or more materials that can increase resistance of the layered structure to perforation or infiltration by a foreign substance (e.g., projectiles, liquid permeation, and the like) across the structure. In one particular embodiment, one or both exterior surfaces of a multi-layer composite can include a reinforcement fiber having high modulus and lower coefficient of thermal expansion, such as glass, for example.

Any layer of the disclosed composite structures can optionally be continuous or discontinuous across the structure. For instance, the composites can be utilized as circuit boards and can include a layer comprising conductive materials arranged in a pattern so as to form an electric circuit on a low loss substrate. As herein defined, the patterned formation of materials such as conductive materials can be considered a single layer of the disclosed composite structures, though the formation may be discontinuous across the surface of an adjacent layer of the structure. For example, multiple layers of composite material can each be patterned with electrical conducting materials to form a circuit, and then these layers can be combined to form a multi-layer electrical circuit board as is well known in the art.

In addition to the amorphous polymer fibers and the resin matrix, the composites can include fillers and/or other reinforcement materials, as are generally known in the art. For example, the composites can include ceramic fillers (e.g., silica) or carbon black. Fillers can be included in one embodiment to provide particular electrical or mechanical characteristics to the structure.

Due to the low dielectric constants and the high thermal resistivity of the amorphous polymers used in the composites, the composite structures can be used in many low loss electrical applications including those involving solder processing. For instance, the composites can be beneficially utilized as a circuit board or antenna substrate or as a protective enclosure for an electromagnetic sending and/or receiving device, such as a radome. For example, composites of the present invention can exhibit a dielectric constant of less than about 4.0 in one embodiment. In another embodiment, the dielectric constant can be lower, for example, less than about 3.7, or even lower in other embodiments, for example less than about 3.5.

The composites of the invention can also have a low density, for example, less than about 1.7 g/cm$^3$, in one embodiment. In another embodiment, the composites can have an even lower density, for instance less than about 1.5 g/cm$^3$.

A low loss composite substrate as herein disclosed can be provided at a lower cost than many previously known low loss substrates due to the relatively low costs associated with amorphous polymeric materials as well as the low cost formation methods that can be used in forming the composites.

Composites as disclosed herein can be used in forming a protective encasing structure that can protect the contents from weather, dirt, and/or other elements that could damage the devices held inside. As the composites can also be transparent to electromagnetic waves of various frequencies, the composites could be utilized to protect the encased electrical devices without impeding the operation of the devices. Such a protective encasement can include multiple composite structures in various combination. For instance, at least a portion of the encasement can be formed from a multi-layer electromagnetically transparent composite in which one or both external layers include high strength reinforcement fibers such as glass, Kevlar®, UHMWPE, or the like, and one or more inner layers include amorphous polymer reinforcement fibers.

One particular example of an electromagnetically transparent protective structure is a radome within which an electromagnetic wave can be generated and transmitted from a dish antenna. The wave can then pass through the radome, and in particular through that portion of the radome comprising a composite structure as described herein. Following wave reflection from an object such as a cloud or an aircraft, the wave can pass back through the radome again and be received again at the dish antenna.

Other known methods for transmitting and/or receiving electromagnetic waves can optionally be considered for various electrical applications of the present invention, in addition to those associated with radar applications. For example, a protective structure as herein described could be utilized to house and protect lasers, masers, diodes, and other electromagnetic wave generation and/or receiving devices. In one particular embodiment, a protective structure as herein described can be utilized in conjunction with devices operating with radio frequency waves, such as those between about 100 kHz and about 100 GHz, or in one embodiment between about 1 MHz and about 50 GHz, or between about 10 MHz and about 20 GHz in another embodiment. Protective structures of the invention could be useful for protecting electrical equipment used to monitor weather patterns, to monitor air or ground traffic, or to detect the presence of aircraft, boats, or other vehicles around military facilities, including warships.

In another electrical embodiment, a laminate composite structure of the invention can be utilized as a substrate for electrical circuits, and in particular for high frequency circuits. For purposes of the present disclosure, the term 'high frequency' is herein defined to be greater than 100 KHz. Accordingly, high frequency electrical circuit boards of the invention can be beneficially utilized for circuits capable of operating at greater than about 100 KHz. In one embodiment, the substrates of the invention can be utilized in conjunction with higher frequency circuits, for example circuits operating at frequencies above about 1 MHz or even higher in other embodiments, for instance above about 1 GHz.

Circuit boards according to the present invention can be composed of multiple layers, at least one of which includes conductive materials in a predetermined pattern so as to form an electrical circuit and at least one other of which is a substrate layer including reinforcement amorphous polymer fibers. Optionally, conductive materials can be included on multiple layers and/or different conductive materials can be included on a single layer and placed in electrical communication with one another, for instance via holes as is generally known in the industry. Optionally, one or more layers of the substrate can be formed from other non-conductive materials, for instance one or more layers of a composite material comprising glass fibers that can provide additional structural benefits to the multi-layer substrate such as, for example, low coefficient of thermal expansion.

In general the circuit boards can be used by first providing an electromagnetic signal of the appropriate frequency, transferring the signal to a circuit of the circuit board through wires, cables, solder joints, and/or other devices as are well known in the art, propagating the signal along the conductive arrangement of the circuit, which may include conductive strips and/or striplines as well as capacitors, transistors, and any other circuit components as are generally known in the art, and then receiving this signal at another element, which can be internal or external to the circuit board, as desired. External elements can include, for example, a computer chip, a memory chip, or any other external electrical device. The signal may optionally be provided via wireless communication from an antenna, or alternately a microwave power sources such as those available in integrated circuits or vacuum tubes, or any other sources as are generally known to those of ordinary skill in the art.

Circuit boards can provide the benefits of low dielectric constant and low dielectric loss, which can result in higher signal integrity, lower data loss, and lower circuit operating voltage, among other benefits that are well known in the art. The circuit boards can also have high thermal conductivity, for use in high temperature applications. The disclosed circuit boards can be an integral portion of a cellular telephone, or beneficially utilized in telephone switching equipment, computers, high power microwave devices, or any other electrical device operating in the microwave frequency as is generally known in the art.

In other embodiments, the composite structures can include one or more layers exhibiting high flexural strength and/or modulus. For example, one or more layers can be formed of a fiber glass woven or nonwoven, a polyaramid nonwoven, such as a Kevlar® fabric, or a carbon fiber mat or nonwoven. In one particular embodiment, these other materials can form the outer layers of the composite structure, with one or more layers sandwiched between the two that contain the amorphous polymer reinforcement fibers. The outer layers could provide to the composite the benefits of these particular materials, but the composite structure can still be a much lower weight and provided at lower cost than previously known composites while still attaining the desired strength characteristics due to the inclusion of the amorphous polymer fibers in the composite.

The present invention may be better understood with reference to the Examples, below.

EXAMPLE 1

Topas® 6017 cyclic olefin copolymer was obtained from Ticona. Pellets were fed into a ¾" extruder with extruder temperature set to 190° C., 230° C. and 270° C. in extruder zones 1-3, and the melt pump and spin head heated to 290° C. The polymer was extruded through a spinneret with 15 orifices of 0.020" diameter, and passed through ~3 meters of room temperature air, then taken up on a first godet running at 1000 m/min and set at a temperature of 150° C. The yarn thus formed was then passed to a second godet, which was running at 1320 m/min and also set at 150° C., the yarn being drawn between the first and second godets. This first yarn was then passed over a third godet, running at 1320 m/min and at room temperature, and then wound on a bobbin. The drawn yarn was 60 denier in size. This first yarn was then woven as a weft yarn across a warp made of 450 s glass yarns with 60 warp yarns/inch. The weft yarn was woven in at 47 picks/inch. This fabric was then dipped in epoxy resin, and layered in a mold, a total of 8 layers, pressed to force out excess resin, and allowed to cure. The composite thus formed was taken from the mold and measured for electrical and mechanical properties, shown in Table 1 below.

For comparison purposes a glass fabric, style 1080, with 450 s glass yarns at 60 ends/inch in the warp and 47 ends/inch in the fill, was molded similarly to the composite described above. The composite was tested similarly, and the results are shown in Table 1.

TABLE 1

|  | fabric containing inventive yarn | comparative glass fabric |
| --- | --- | --- |
| Dielectric Constant | 3.52 | 4.65 |
| Loss Tangent | 0.018 | 0.021 |
| Flexural Modulus | 2764 ksi | 3125 ksi |
| Flexural Strength | 42.4 ksi | 43.3 ksi |
| Density | 1.2 g/cm$^3$ | 1.6 g/cm$^3$ |

A second yarn was made under identical conditions to the first yarn described above, except that the polymer flow was higher, to create a yarn of 120 denier. The yarn was twisted, and then woven in the same configuration as described above. This yarn was also twist plied with a 450 s glass yarn. This composite yarn was woven in an identical configuration to the fabric described above.

The first yarn described above was twist plied with a 450 s glass yarn. This composite yarn was woven in an identical configuration to the inventive fabric described in Table 1. The fabric was examined for defects and seen to be acceptable for circuit board substrate applications.

It will be appreciated that the foregoing examples, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention that is defined in the following claims and all equivalents thereto. Further, it is recognized that many embodiments may be conceived that do not achieve all of the advantages of some embodiments, yet the absence of a particular advantage shall not be construed to necessarily mean that such an embodiment is outside the scope of the present invention.

What is claimed is:

1. A composite comprising:
   a polymeric resin matrix;
   a plurality of first fibers held in the polymeric resin matrix, the first fibers having a dielectric constant below about 3.5, the first fibers comprising an amorphous polymer; and
   a plurality of second fibers held in the polymeric resin matrix.

2. The composite of claim 1, wherein the plurality of first fibers and the plurality of second fibers are in a fabric.

3. The composite of claim 1, wherein the second fibers are glass fibers.

4. The composite of claim 1, wherein the resin is a thermoset resin.

5. The composite of claim 1, wherein the first fibers comprise a cyclic olefin copolymer.

6. The composite of claim 1, wherein the first fibers have a modulus greater than about 70 grams/denier.

7. The composite of claim 1, wherein the composite has a dielectric constant of less than about 4.0.

8. The composite of claim 1, wherein the first fibers exhibit only amorphous halo type scattering when observed under wide angle x-ray scattering.

9. The composite of claim 1, wherein the second fibers have a modulus greater than about 150 grams/denier.

* * * * *